US012740035B2

(12) United States Patent
Kang et al.

(10) Patent No.: US 12,740,035 B2
(45) Date of Patent: Sep. 15, 2026

(54) POWER CONTROL SYSTEM OF ELECTRONIC COMPONENT MOUNTING APPARATUSES

(71) Applicant: HANWHA PRECISION MACHINERY CO., LTD., Changwon-si (KR)

(72) Inventors: Kyung Wan Kang, Changwon-si (KR); Min Ju Koh, Changwon-si (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 479 days.

(21) Appl. No.: 18/127,413

(22) Filed: Mar. 28, 2023

(65) Prior Publication Data

US 2023/0232604 A1 Jul. 20, 2023

Related U.S. Application Data

(63) Continuation of application No. PCT/KR2021/013248, filed on Sep. 28, 2021.

(30) Foreign Application Priority Data

Sep. 28, 2020 (KR) ........................ 10-2020-0125480

(51) Int. Cl.
*H05K 13/08* (2006.01)

(52) U.S. Cl.
CPC ................................ *H05K 13/0885* (2018.08)

(58) Field of Classification Search
CPC .................................................. H05K 13/0885
See application file for complete search history.

(56) References Cited

U.S. PATENT DOCUMENTS 6,701,611 B1 * 3/2004 Izumida ............. H05K 13/0885 29/829
2006/0283009 A1 * 12/2006 Shin ................... H05K 13/0409 29/743

(Continued)

FOREIGN PATENT DOCUMENTS

CN 1416263 A 5/2003
CN 202257172 U * 5/2012

(Continued)

OTHER PUBLICATIONS

International Search Report (PCT/ISA/210) issued from the International Searching Authority on Jan. 7, 2022 to Application No. PCT/KR2021/013248.

(Continued)

*Primary Examiner* — Suresh Suryawanshi
(74) *Attorney, Agent, or Firm* — Sughrue Mion, PLLC

(57) ABSTRACT

A power control system includes electronic component mounting apparatuses; power control modules configured to control power of the electronic component mounting apparatuses; a power controller configured to turn on and off the power of the electronic component mounting apparatuses by controlling the power control modules, or receive signals from the power control modules indicating power on and off states of the electronic component mounting apparatuses; and a remote control module that is remote from the electronic component mounting apparatuses and is configured to control the power of electronic component mounting apparatuses by controlling the power controller via a wired or wireless connection.

9 Claims, 5 Drawing Sheets

(56) References Cited

U.S. PATENT DOCUMENTS

| | | | | |
|---|---|---|---|---|
| 2007/0270992 | A1* | 11/2007 | Nishida | H05K 13/0885 700/99 |
| 2014/0340801 | A1* | 11/2014 | Sievi-Korte | H01H 83/20 361/87 |
| 2016/0174426 | A1* | 6/2016 | Kurata | H05K 13/08 29/739 |
| 2017/0079168 | A1* | 3/2017 | Kawaguchi | H05K 13/0413 |
| 2018/0061603 | A1* | 3/2018 | Hendrixson, III | H02J 13/00036 |

FOREIGN PATENT DOCUMENTS

| | | | | | |
|---|---|---|---|---|---|
| CN | 207426698 | U | | 5/2018 | |
| JP | 2001320199 | A | | 11/2001 | |
| JP | 2005250520 | A | * | 9/2005 | |
| JP | 2006310750 | A | | 11/2006 | |
| JP | 2006313806 | A | * | 11/2006 | |
| JP | 2014220396 | A | * | 11/2014 | H05K 13/02 |
| JP | 2018056231 | A | | 4/2018 | |
| KR | 10-1233912 | B1 | | 2/2013 | |
| TW | M551375 | U | * | 11/2017 | |
| WO | WO-2016103503 | A1 | * | 6/2016 | H05K 1/18 |

OTHER PUBLICATIONS

Written Opinion (PCT/ISA/237) issued from the International Searching Authority on Jan. 7, 2022 to Application No. PCT/KR2021/013248.

Communication dated Sep. 10, 2025, issued by the China National Intellectual Property Administration in Chinese Application No. 202180066630.7.

Communication dated Jun. 5, 2026, issued by the China National Intellectual Property Administration in Chinese Application No. 202180066630.7.

* cited by examiner 100
140
130
Ethernet
SERIAL COMMUNICATION OR I/O
STATE
COMMAND
POWER CONTROL MODULE
POWER
120
110
111

FIG. 3

POWER CONTROL SYSTEM OF ELECTRONIC COMPONENT MOUNTING APPARATUSES

CROSS-REFERENCE TO THE RELATED APPLICATIONS

This application is a bypass Continuation application of PCT Application No. PCT/KR2021/013248, filed on Sep. 28, 2021, which claims priority to Korean Patent Application No. 10-2020-0125480, filed on Sep. 28, 2020, in the Korean Intellectual Property Office, the disclosures of which are incorporated by reference herein in their entireties.

BACKGROUND

1 Field

Embodiments of the present disclosure relate to a power control system of electronic component mounting apparatuses, and more particularly, to a power control system of electronic component mounting apparatuses capable of controlling power of all electronic component mounting apparatuses configured in a line remotely using a network.

2. Description of Related Art

A general electronic component mounting apparatus is an apparatus that mounts an electronic component on a desired position of a substrate by sucking the electronic component to the tip of a suction nozzle using a negative pressure, moving a head including the suction nozzle to predetermined coordinates of the substrate, and applying a positive pressure to the tip of the suction nozzle at that position.

In general, several electronic component mounting apparatuses for sucking, moving, and attaching the electronic components are continuously disposed and are configured in one line, and a plurality of such lines may be provided.

That is, in general, several electronic component mounting apparatuses are continuously disposed and operated in at least one line, and when a worker wants to turn on/off power of the electronic component mounting apparatuses configured in such at least one line, the worker should manually operate power and operating software of the respective apparatuses one by one, which is troublesome.

In addition, when starting production, servo-on and axis homing times are required, and additional time such as production program selection may be required, such that the time required is increased in proportion to the number of electronic component mounting apparatuses, and thus, manpower and time are required and work efficiency is lowered.

Accordingly, there is a need for a remote control device of electronic component mounting apparatuses capable of controlling on and off of power of electronic component mounting apparatuses and controlling the power of the electronic component mounting apparatuses remotely rather than implementing the turning on and off of the power of the electronic component mounting apparatuses individually in the electronic component mounting apparatuses.

SUMMARY

Aspects of embodiments of the present disclosure provide a power control system of electronic component mounting apparatuses capable of controlling power of apparatuses included in the electronic component mounting apparatus at the center and preventing an accident due to unintentional power-on/off.

However, aspects of embodiments of the present disclosure are not restricted to those set forth herein. The above and other aspects will become more apparent to one of ordinary skill in the art to which the present disclosure pertains by referencing the detailed description of the present disclosure given below.

According to embodiments of the present disclosure, a power control system is provided. The power control system includes electronic component mounting apparatuses; power control modules configured to control power of the electronic component mounting apparatuses; a power controller configured to turn on and off the power of the electronic component mounting apparatuses by controlling the power control modules, or receive signals from the power control modules indicating power on and off states of the electronic component mounting apparatuses; and a remote control module that is remote from the electronic component mounting apparatuses and is configured to control the power of electronic component mounting apparatuses by controlling the power controller via a wired or wireless connection.

According to one or more embodiments of the present disclosure, the power control modules are connected to the electronic component mounting apparatuses, respectively, and configured to control the power of the electronic component mounting apparatuses, respectively.

According to one or more embodiments of the present disclosure, each of the power control modules includes: an actuator; a main circuit breaker (MCB) connected to the actuator; and a safety module mounted on the actuator, the safety module configured to receive a power state signal of at least one of the electronic component mounting apparatuses, and the safety module implements a state change prohibition setting.

According to one or more embodiments of the present disclosure, the power controller includes a programmable logic controller (PLC) that is configured to process communication and input/output (IO) signals, control the power of the electronic component mounting apparatuses by sending power on and off signals to the power control modules, receive signals from the power control modules indicating the power on and off states of the electronic component mounting apparatuses, and signal the power on and off states to the remote control module.

According to one or more embodiments of the present disclosure, the power control system of claim 1, wherein in order for the apparatus to be turned on from a turn-off state, the remote control module receives a power-on command for starting production, the remote control module applies an execution command to an operating system of the electronic component mounting apparatus according to the power-on command of the apparatus, and preparation of a production program for producing the electronic components is executed in the apparatus.

According to one or more embodiments of the present disclosure, in the turn-off states of the apparatuses, individual states of the apparatuses are integrated in the power controller through the power control modules individually connected to the respective apparatuses and are applied to the remote control module.

According to one or more embodiments of the present disclosure, each operation state in which the power-on command is applied, the execution command is applied, or the preparation of the production program is executed is applied to the power controller, and when an abnormality occurs in the applied result value, each operation is stopped and an error is generated.

According to one or more embodiments of the present disclosure, when an end command is applied in order for the apparatus to be turned off in a turn-on state, the remote control module applies an off-drive command for ending production and applies a servo-off command to an operating system of the electronic component mounting apparatus according to the off-drive command, and a command for turning off the power control module is applied, such that the apparatus ends the production of the electronic component.

According to one or more embodiments of the present disclosure, each operation state in which the off-drive command is applied, the servo-off command is applied, or the production of the electronic component is ended is applied to the power controller, and when an abnormality occurs in the applied result value, each operation is stopped and an error is generated.

The specific details of other example embodiments are included in the detailed descriptions and drawings.

As described above, a power control system of electronic component mounting apparatuses according to an embodiment of the present disclosure has advantages of remotely controlling power of all apparatuses of a line and completing production preparation work.

In addition, the power control system of electronic component mounting apparatuses according to an embodiment of the present disclosure has advantages of managing all the apparatuses of the line at one place by a worker and saving production preparation time.

The effects of embodiments of the present disclosure are not limited to the above-described effects and other effects which are not described herein will become apparent to those skilled in the art from the following description.

BRIEF DESCRIPTION OF DRAWINGS

FIG. 3 is a schematic diagram illustrating a configuration of a power control module in the power control system of electronic component mounting apparatuses according to an embodiment of the present disclosure.

DETAILED DESCRIPTION

Figure 1:
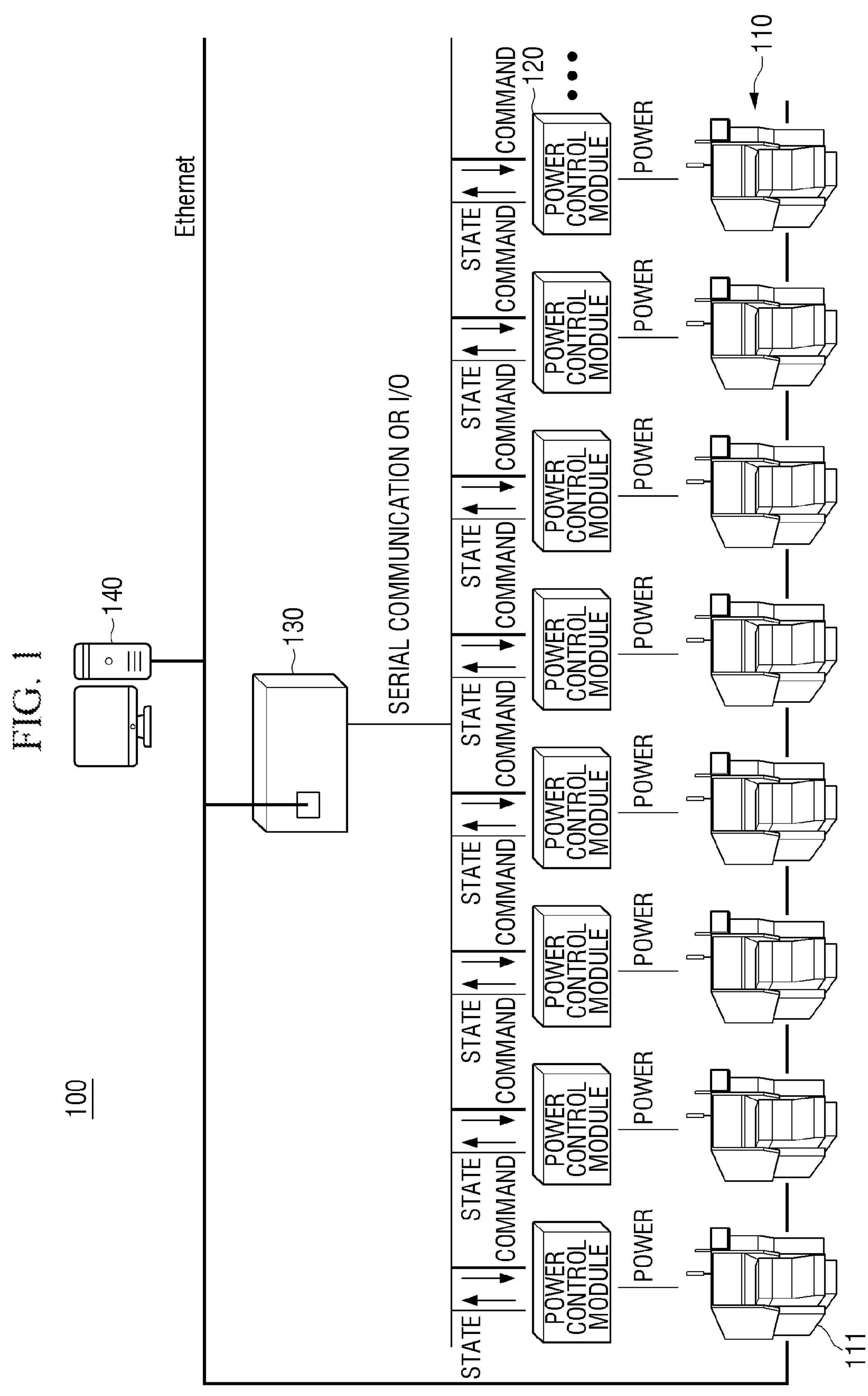
FIG. 1 is a schematic diagram illustrating a configuration of a power control system of electronic component mounting apparatuses according to an embodiment of the present disclosure.

Advantages and features of embodiments of the present disclosure will become apparent from the below descriptions of non-limited example embodiments with reference to the accompanying drawings. However, embodiments of the present disclosure are not limited to the example embodiments described herein and may be implemented in various ways. The non-limiting example embodiments are provided for making the present disclosure thorough and for fully conveying the scope of the present disclosure to those skilled in the art. Like reference numerals denote like elements throughout the descriptions.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Terms used herein are for describing the example embodiments rather than limiting the present disclosure. As used herein, the singular forms are intended to include plural forms as well, unless the context clearly indicates otherwise. Throughout this specification, the word "comprise" and variations such as "comprises" and "comprising," and "include" and variations such as "includes" and "including" will be understood to imply the inclusion of stated elements but not the exclusion of any other elements.

In addition, the embodiments described in this specification will be explained with reference to cross-sectional and/or schematic diagrams, which are non-limiting examples. Therefore, the form of the diagrams may be modified by manufacturing techniques and/or permissible errors. Thus, embodiments of the present disclosure include variations in form that are generated according to the manufacturing process, rather than being limited to specific forms depicted in the diagrams. Additionally, in each diagram provided in the present disclosure, each component may be somewhat enlarged or reduced for the convenience of explanation. Throughout the entire specification, the same reference numerals denote the same components.

It will be understood that when an element is referred to as being "on," "connected to," or "coupled to" another element, it can be directly on, connected to, or coupled to the other element or intervening elements may be present. In contrast, when an element is referred to as being "directly on," "directly connected to," or "directly coupled to" another element, there are no intervening elements present.

Hereinafter, non-limiting example embodiments will be described with reference to the drawings for describing a power control system 100 of electronic component mounting apparatuses according to embodiments of the present disclosure.

Figure 2:
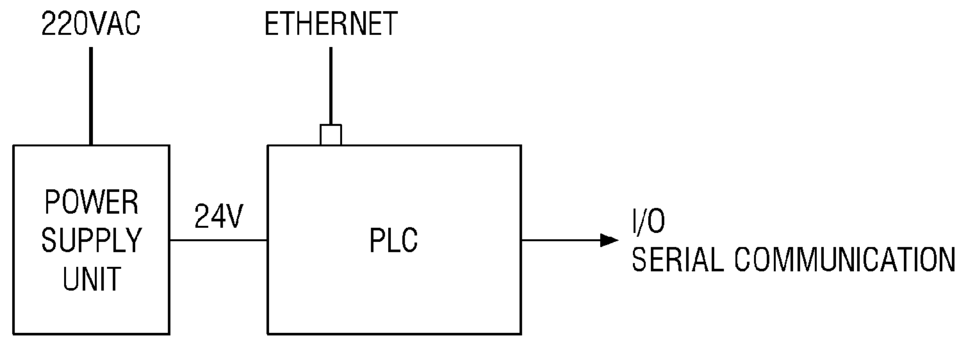
FIG. 2 is a schematic diagram illustrating a configuration of a line power controller in the power control system of electronic component mounting apparatuses according to an embodiment of the present disclosure.
Figure 3:
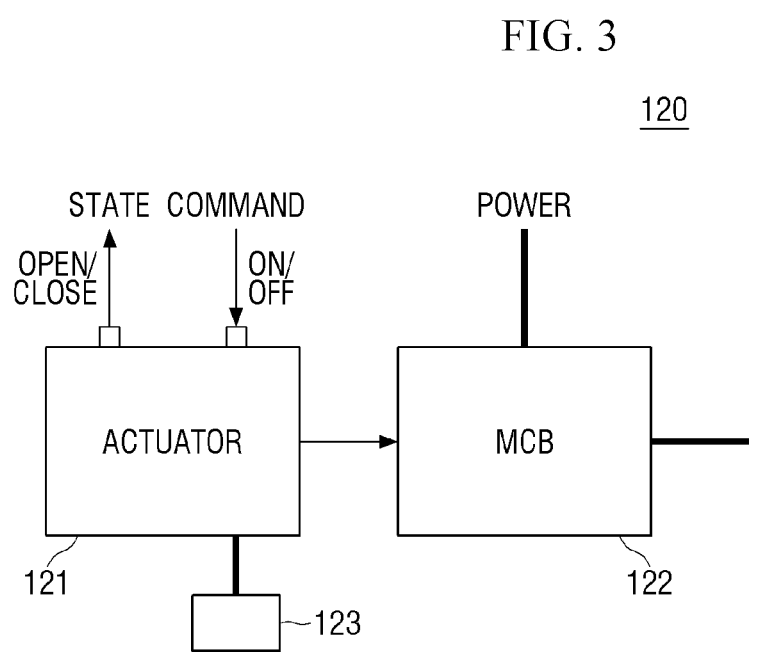

FIG. 1 is a schematic diagram illustrating a configuration of a power control system 100 of electronic component mounting apparatuses according to an embodiment of the present disclosure. FIG. 2 is a schematic diagram illustrating a configuration of a line power controller 130 in the power control system 100 of electronic component mounting apparatuses according to an embodiment of the present disclosure. FIG. 3 is a schematic diagram illustrating a configuration of a power control module 120 in the power control system 100 of electronic component mounting apparatuses according to an embodiment of the present disclosure.

Referring to FIGS. 1 to 3, the power control system 100 for an electronic component mounting apparatus according to an embodiment of the present disclosure includes a line 110, power control modules 120, a line power controller 130, and a remote control module 140.

Apparatuses 111 for mounting electronic components may be configured in the line 110, and at least one line 110 may be provided.

The power control modules 120 may be provided to be connected to the apparatuses 111, respectively, to control power of the respective apparatuses 111, and may be provided to signal states of the apparatuses 111 to the line power controller 130.

Specifically, the power control module 120 may include an actuator 121, a main circuit breaker 122 (MCB), and a safety module 123.

The power control module 120 may be provided to signal the power state of the apparatus 111 to the line power controller 130 to be described later by open/close driving of the actuator 121 and to receive a command applied from the line power controller 130 by open/close driving of the actuator 121.

The main circuit breaker 122 may be provided to be connected to the actuator 121 so as to prevent the occurrence of an accident due to an unintentional power-on/off signal.

The safety module 123 may be provided to be connected between the actuator 121 and the apparatus 111 to share a state signal of the line 110, in particular, the status of each piece of apparatus and implement a state change prohibition setting of the line 110.

Specifically, the power control module 120 may be provided to have voltage and current capacities capable of remotely controlling the power of the apparatus 111, and signals and functions may be added to the power control module 120 so as to prevent an accident. The power control module 120, specifically, the actuator 121 is implemented to confirm a state signal and operate so that the power is not accidentally turned off while the apparatus 111 is normally operated. In addition, the power control module 120, specifically, the safety module 123, implements a state change prohibition setting function, which may be manually set in the apparatus 111, so as to prohibit turning on the power from the outside during maintenance of the apparatus 111 thereby preventing an accident from occurring. Referring to FIG. 3, the safety module 123 may be configured to open/close a state according to the on/off of a command.

The line power controller 130 may turn on and off the power of each apparatus 111 of each line 110 by controlling the power control modules 120 and/or may receive signals from the power control modules 120 indicating power on and off states of each apparatus 111 of each line 110 through at least a first method with the power control modules 120.

The line power controller 130 may be configured as a programmable logic controller (PLC). Accordingly, the line power controller 130 may be provided to process communication and input/output (IO) signals. The line power controller 130 may be provided to transfer power-on/off signals to the respective power control modules 120, receive and collect indications of power states of the apparatuses 111 from the power control modules 120, respectively, and apply a collected result value to the remote control module 140.

The remote control module 140 may be provided to control the power of each apparatus 111 of each line 110 via the line power controller 130 through, for example, a local area network or a remote area network via a wired or wireless connection. For example, power may be controlled via Ethernet. A non-limiting example using Ethernet is described below. Specifically, the remote control module 140 may be provided to be connected to the line power controller 130 and/or connected to the respective apparatuses 111 through Ethernet to control the power. Accordingly, the remote control module 140 may be provided to control the power of the respective apparatuses 111 through the power control modules 120 and individually control the power of the respective apparatuses 111.

As described above, the power of all the apparatuses 111 of the line 110 may be remotely controlled, and accordingly, a production preparation work may be additionally completed in advance.

Figure 4:
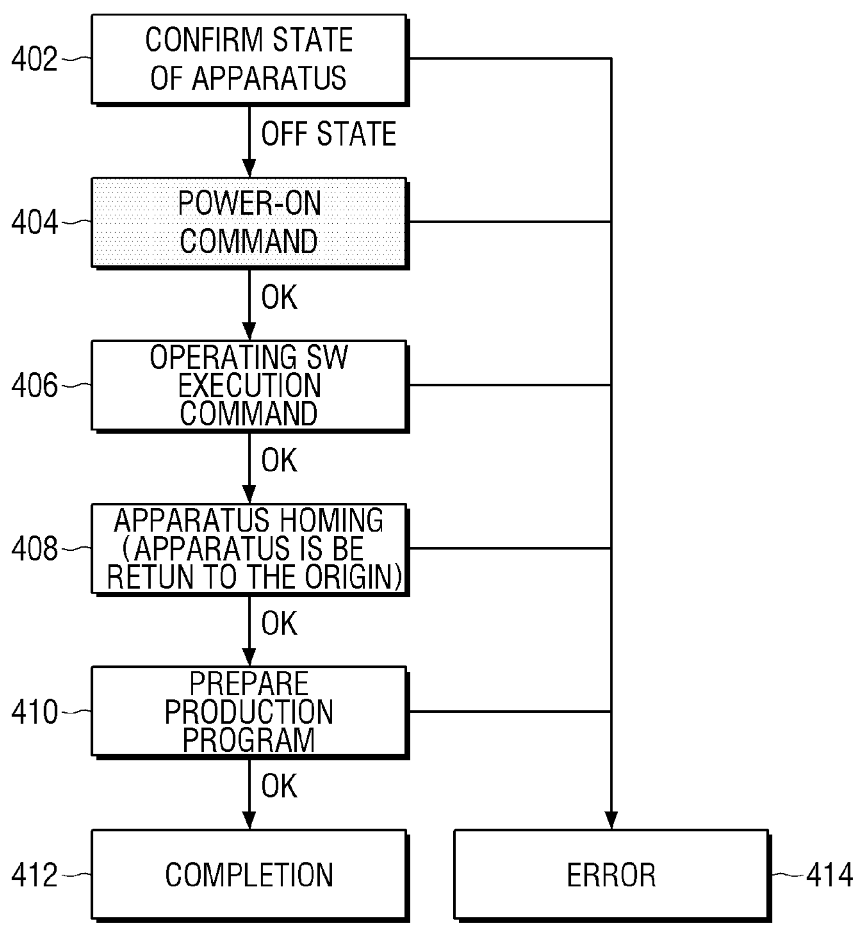
FIG. 4 is a flowchart of a power-on operation in the power control system of electronic component mounting apparatuses according to an embodiment of the present disclosure.
Figure 5:
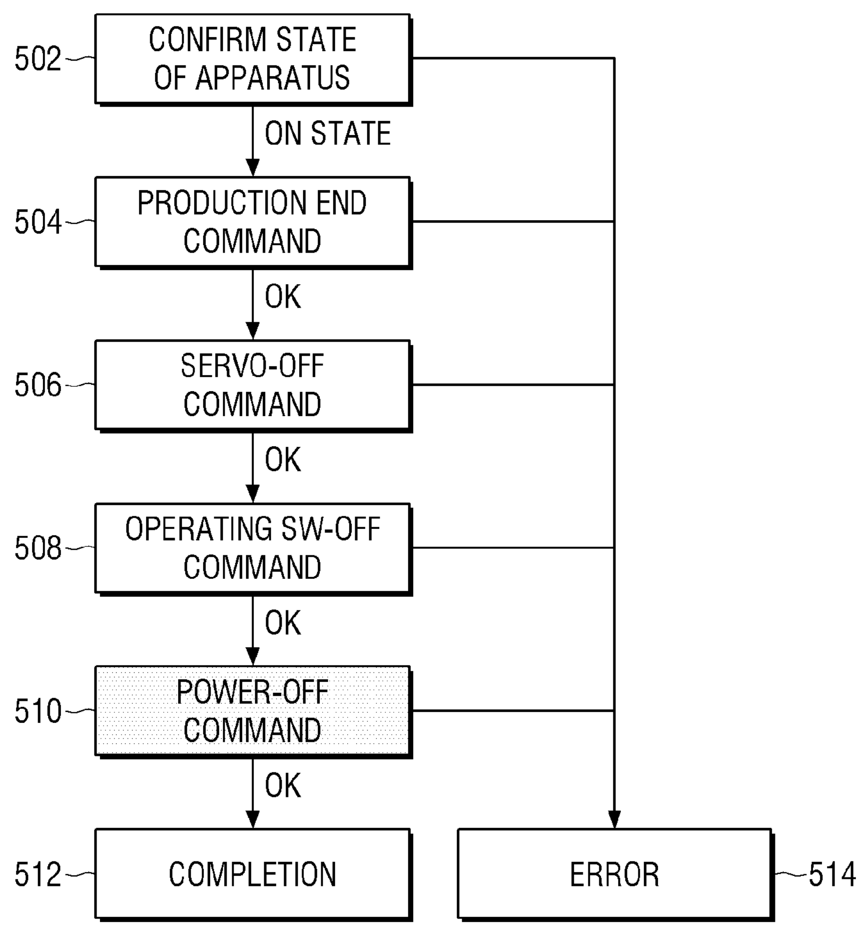
FIG. 5 is a flowchart of a power-off operation in the power control system of electronic component mounting apparatuses according to an embodiment of the present disclosure.

FIG. 4 is a flowchart of a power-on operation 400 in the power control system 100 of electronic component mounting apparatuses according to an embodiment of the present disclosure. FIG. 5 is a flowchart of a power-off operation 500 in the power control system 100 of electronic component mounting apparatuses according to an embodiment of the present disclosure.

A power-on operation flow and a power-off operation flow according to embodiments of the present disclosure will be described with reference to FIGS. 4 and 5.

First, a power-on operation 400 flow for turning on power in the power control system 100 of electronic component mounting apparatuses according to an embodiment of the present disclosure will be described. Individual states of the respective apparatuses 111 may be signaled to and integrated in the line power controller 130 through the power control modules 120, and an integrated result value may be signaled to the remote control module 140 by the line power controller 130, such that the states of the apparatuses 111 may be confirmed (step 402, CONFIRM STATE OF APPARATUS step).

When the apparatus 111 is in an off state, the remote control module 140 may be applied a power-on command for starting production (step 404, POWER-ON COMMEND step). An execution command may be applied to an operating system (operating SW) of the remote control module 140 for the power-on command of the apparatus 111 (step 406, OPERATING SW EXECUTION COMMAND step).

With the execution command of the operating system of the apparatus 111 applied to operating system of the remote control module 140, the states of the respective apparatuses 111 may be homed (returned to the origin) (step 408, APPARATUS HOMING (return to the origin) step), and preparation of a production program for producing electronic components may be executed (step 410, PREPARE PRODUCTION PROGRAM step).

In the progress of each step, each operation state is confirmed while communicating with the electronic component mounting apparatus or the line power controller 130. In this state, when an abnormal state is sensed during the confirming of each operation state, the progress of the step may be stopped and an error may be generated (step 414, ERROR step). When no abnormal state is sensed during the confirming of each operation state, the power-on operation 400 flow may be completed (step 412, COMPLETION step).

In addition, a power-off operation 500 flow for turning off power in the power control system 100 of electronic component mounting apparatuses according to an embodiment of the present disclosure will be described. Individual states of the respective apparatuses 111 may be signaled to the remote control module 140 through the power control modules 120 and the line power controller 130, such that the states of the apparatuses 111 may be confirmed (step 502, CONFIRM STATE OF APPARATUS step).

When the apparatus 111 is in an on state, the remote control module 140 may apply an end command for ending production (step 504, PRODUCTION END COMMEND step). A servo-off command may be applied according to the application of the production end command (step 506, SERVO-OFF COMMEND step). Due to the application of the servo-off command, an end command of the operating system (operating SW) may be applied (step 508, OPER- ATING SW-OFF COMMAND step). When the end command of the operating system is applied, a command for turning off the power control module 120 may be applied (step 510). Accordingly, the power of the respective apparatuses 111 may be turned off. In addition, in the progress of each step, each operation state is confirmed while communicating with the electronic component mounting apparatus or the line power controller 130. In this state, when an abnormal state is sensed, the progress of the step may be stopped and an error may be generated (step 514, ERROR step). When no abnormal state is sensed during the confirming of each operation state, the power-off operation 500 flow may be completed (step 512, COMPLETION step).

According to embodiments of the present disclosure, one or more (e.g., some or all) of the remote control module 140, the line power controller 130, the power control modules 120, and the apparatuses 111 may include at least one processor and memory storing computer instructions. The computer instructions, when executed by the at least.

Many modifications and other embodiments of the present disclosure will come to the mind of one skilled in the art having the benefit of the teachings presented in the foregoing descriptions and the associated drawings. Therefore, it is understood that the present disclosure is not to be limited to the example embodiments described above, and that modifications and other embodiments are intended to be included within the scope of the present disclosure.

What is claimed:

1. A power control system comprising:

electronic component mounting apparatuses;

power control modules individually configured to control power of the electronic component mounting apparatuses, respectively;

a power controller configured to turn on and off the power of the electronic component mounting apparatuses by controlling the power control modules, and receive signals from the power control modules indicating power on and off states of the electronic component mounting apparatuses; and a remote control module that is remote from the electronic component mounting apparatuses and is configured to control the power of each of the electronic component mounting apparatuses by controlling the power controller via a wired or wireless connection, wherein the power controller is configured to signal the power on and off states of the electronic component mounting apparatuses to the remote control module.

2. The power control system of claim 1, wherein the power control modules are connected to the electronic component mounting apparatuses, respectively, and configured to control the power of the electronic component mounting apparatuses, respectively.

3. The power control system of claim 1, wherein each of the power control modules comprises:

an actuator;

a main circuit breaker (MCB) connected to the actuator; and a safety module mounted on the actuator, the safety module configured to receive a power state signal of at least one of the electronic component mounting apparatuses, and implement a state change prohibition setting.

4. The power control system of claim 1, wherein the power controller comprises a programmable logic controller (PLC) that is configured to process communication and input/output (IO) signals, control the power of the electronic component mounting apparatuses by sending power on and off signals to the power control modules, receive signals from the power control modules indicating the power on and off states of the electronic component mounting apparatuses, and signal the power on and off states to the remote control module.

5. A power control system comprising:

electronic component mounting apparatuses;

power control modules individually configured to control power of the electronic component mounting apparatuses, respectively:

a power controller configured to turn on and off the power of the electronic component mounting apparatuses by controlling the power control modules, and receive signals from the power control modules indicating power on and off states of the electronic component mounting apparatuses; and a remote control module that is remote from the electronic component mounting apparatuses and is configured to control the power of the electronic component mounting apparatuses by controlling the power controller via a wired or wireless connection, wherein in order for at least one of the electronic component mounting apparatuses to be turned on from a turn-off state, the remote control module receives a power-on command for starting production, wherein the remote control module applies an execution command to an operating system of the at least one of the electronic component mounting apparatuses according to the power-on command of the at least one of the electronic component mounting apparatuses, and wherein preparation of a production program for producing the electronic components is executed in the at least one of the electronic component mounting apparatuses.

6. The power control system of claim 5, wherein in the turn-off states of the electronic component mounting apparatuses, individual states of the electronic component mounting apparatuses are integrated in the power controller through the power control modules individually connected to the respective electronic component mounting apparatuses and are applied to the remote control module.

7. The power control system of claim 5, wherein each operation state in which the power-on command is applied, the execution command is applied, or the preparation of the production program is executed is applied to the power controller, and when an abnormality occurs in the applied result value, each operation is stopped and an error is generated.

8. A power control system comprising:

electronic component mounting apparatuses;

power control modules individually configured to control power of the electronic component mounting apparatuses, respectively;

a power controller configured to turn on and off the power of the electronic component mounting apparatuses by controlling the power control modules, and receive signals from the power control modules indicating power on and off states of the electronic component mounting apparatuses; and a remote control module that is remote from the electronic component mounting apparatuses and is configured to control the power of the electronic component mounting apparatuses by controlling the power controller via a wired or wireless connection, wherein when an end command is applied in order for at least one of the electronic component mounting apparatuses to be turned off in a turn-on state, the remote control module applies an off-drive command for ending production and applies a servo-off command to an operating system of the at least one of the electronic component mounting apparatuses according to the off-drive command, and a command for turning off the power controller is applied, such that the at least one of the electronic component mounting apparatuses apparatus-ends the production of the an electronic component.

9. The power control system of claim 8, wherein each operation state in which the off-drive command is applied, the servo-off command is applied, or the production of the electronic component is ended is applied to the power controller, and when an abnormality occurs in the applied result value, each operation is stopped and an error is generated.

* * * * *